US005264073A

United States Patent [19]
Cheng

[11] Patent Number: 5,264,073
[45] Date of Patent: Nov. 23, 1993

[54] HYDROTHERMAL PROCESS FOR GROWING OPTICAL-QUALITY SINGLE CRYSTALS AND AQUEOUS MINERALIZER THEREFOR

[75] Inventor: Lap K. Cheng, Bear, Del.

[73] Assignee: E. I. Du Pont de Nemours and Company, Wilmington, Del.

[21] Appl. No.: 843,679

[22] Filed: Feb. 28, 1992

[51] Int. Cl.$^5$ .............................................. C30B 9/12
[52] U.S. Cl. ................................ 156/623 R; 156/621; 156/622; 156/624; 156/DIG. 71; 156/DIG. 73
[58] Field of Search ................ 156/621, 622, 6223 R, 156/624, DIG. 71, DIG. 73

[56] References Cited

U.S. PATENT DOCUMENTS

| | | | |
|---|---|---|---|
| 3,949,323 | 4/1976 | Bierlein et al. | 332/7.51 |
| 4,305,778 | 12/1981 | Gier | 156/623 R |
| 4,382,840 | 5/1983 | Chai et al. | 156/623 R |
| 4,654,111 | 3/1987 | Laudise | 156/623 R |
| 4,961,819 | 10/1990 | Marnier | 156/623 R |
| 5,066,356 | 11/1991 | Ferretti et al. | 156/623 R |

OTHER PUBLICATIONS

Derwent Abstract, No. 91-191105. (1991).
Ballman, A. A., et al., "Growth of Potassium Titanyl Phosphate (KTP) from Molten Tungsate Melts", *J. Crystal Growth*, 75 (1986) 390-394.
Belt, R. F., "Low-Temperature Hydrothermal Growth of KTiOP$_4$ (KTP)", *SPIE Proc.* 968, 100 Aug. 1988.
Gashurov, G., et al., "Growth of KTP*", *Tunable Solid State Lasers for Remote Sensing*, Proceedings of NASA Conference, Stanford University, Stanford, USA, (Oct. 1-3, 1984), ED R. L. Byer, et al., Springer-Verlag, Berlin, Heidelberg, New York, Tokyo.
El Haidouri, A., "Correlation between Structure and Second Harmonic Generation in M$^I$TiOAsO$_4$ Compounds", *Mat. Res. Bull.*, vol. 25, pp. 1193-1202, (Jan. 1990).
Jia S., et al., "The Solubility of KTiOPO$_4$ (KTP) in KF Aqueous Solution under High Temperature and High Pressure", *J. Crystal Growth* 79 (1986) 970-973.
Jia S., et al., "Hydrothermal Growth of KTP Crystals in the Medium Range of Temperature and Pressure", *J. Crystal Growth* 99 (1990) 900-904.
Laudise, R. A., "7.3 Hydrothermal Growth", *The Growth of Single Crystals*, Prentice-Hall, Englewood Cliffs, (1970), pp. 275-293.
Laudise, R. A., et al. "Phase Relations, Solubility and Growth of Potassium Titanyl Phosphate, KTP", *J. Crystal Growth* 74 (1986) 275-280.
Laudise, R. A., et al., "Solubility and P-V-T Relations and the Growth of Potassium Titanyl Phosphate", *J. Crystal Growth* 102 (1990) 427-433.
Marnier, G. ,et al., "Ferroelectric Transition and Melting Temperatures of New Compounds: CsTiOAsO$_4$ and Cs$_x$M$_{1-x}$TiOAs$_y$P$_{1-y}$O$_4$ with M=K or Rb", *J. Phys.-:Condens.Matter* 1 (Feb. 1989) 5509-5513.
Passaret, M., et al., "recrystallization of TiO$_2$, GeO$_2$, Si$_{1-x}$Ge$_x$O$_2$ in Fluorined Hydrothermal Solutions", *J. Cryst. Growth* 13/14 (1972) 524-9.
Protas, P. J., "Structure Cristalline de CsTiO(AsO$_4$)", *Acta Cryst.* (1989) C45, 1123-1125.
Belt, R. F., et al., "Nonlinear Optical Materials for Second Harmonic Generation (KTP); Phase I: Preparation of 5MM Cubes," Avionics Laboratory, Wright--Patterson Air Force Base, Ohio: May 1984 (94 pages).

*Primary Examiner*—Olik Chaudhuri
*Assistant Examiner*—Felisa Garrett

[57] ABSTRACT

A hydrothermal process is disclosed for growing a crystal at MTiOXO$_4$ wherein M is NH$_4$, K, Rb and/or Tl or mixtures thereof with Cs and X is P and/or As, at elevated temperatures using a mineralizer comprising both M$^{+1}$ and X$^{+5}$ and an amount of F$^-$ effective to increase the solubility of MTiOXO$_4$ in the mineralizer. Mineralizers containing F$^{-1}$, M$^{+1}$ and X$^{+5}$ are disclosed wherein F$^{-1}$ is present in an amount effective to increase the solubility of MTiOXO$_4$ in the mineralizer and to provide a MTiOXO$_4$ solubility of at least about 1% by weight at the operating temperature and pressure for the hydrothermal production.

11 Claims, 1 Drawing Sheet

HYDROTHERMAL PROCESS FOR GROWING OPTICAL-QUALITY SINGLE CRYSTALS AND AQUEOUS MINERALIZER THEREFOR

FIELD OF THE INVENTION

This invention relates to producing optically useful crystals of $MTiOXO_4$, wherein M is selected from the group consisting of $NH_4$, K, Rb, Tl, mixtures thereof and mixtures of Cs therewith, and X is selected from the group consisting of P, As and mixtures thereof, and more particularly to hydrothermal processes for producing such crystals.

BACKGROUND OF THE INVENTION

The need for optical quality single crystals of materials exhibiting nonlinear optical properties is well established in the art. Potassium titanyl phosphate (i.e. KTP) is particularly useful in nonlinear optical devices, as described, for example, in U.S. Pat. No. 3,949,323. Optical quality crystals having dimensions on the order of one millimeter or more are particularly useful for many optical applications.

Processes for producing optical quality crystals using aqueous systems are known generally in the art as hydrothermal processes, and processes for producing such crystals using nonaqueous molten salt systems are known generally in the art as flux processes. Hydrothermal processes are considered particularly advantageous relative to flux processes for growing crystals for certain applications since hydrothermal processes often produce crystals having better optical damage resistance and relatively lower ionic conductivity. Typically, hydrothermal processes involve growing the crystal in a vessel having a growth region where the crystal grows and a nutrient region containing nutrient for growing the crystal, and employ an aqueous mineralizer solution (i.e., a mineralizer).

For example, one type of mineralizer used for hydrothermal crystal growth of KTP uses a mineralizer containing both potassium and phosphate. A typical commercial production of KTP crystals, described by Belt et al., SPIE Proceedings, 968, 100 (1988), uses a potassium phosphate mineralizer at a temperature in the range of about 520° C. to 560° C. and a pressure in the range of about 1700 to 2000 atmospheres. The relatively high temperature and pressure employed in this process makes scale-up difficult and expensive. As suggested in Laudise et al., "Solubility and P-V-T Relations and the Growth of Potassium Titanyl Phosphate", Journal of Crystal Growth, 102, pp. 427–433 (1990) the use of more moderate conditions can lead to a problem of the coprecipitation of anatase ($TiO_2$), making the process less useful. Mineralizers rich in potassium have been used under conditions of fairly moderate temperature (e.g., 275° to 425° C.) and pressure (e.g., less than 14,000 psi) as described in U.S. Pat. No. 5,066,356. Although U.S. Pat. No. 5,066,356 demonstrates that growth temperature and pressure can be reduced while using certain concentrated mineralizer solutions, the growth rate of that process is somewhat limited due to the relatively low solubility of $KTiOPO_4$ in the mineralizer. U.S. Pat. No. 4,305,778 discloses a hydrothermal process for crystal growth which utilizes a stable glass composition that minimizes the tendency of the seed crystals to dissolve in the aqueous mineralizer solution before nutrient can migrate to the seed crystals.

Another type of mineralizer used for the hydrothermal growth of $KTiOPO_4$ involves the use of potassium fluoride solutions as described, for example, in Jia et al., "The Solubility of $KTiOPO_4$ (KTP) in KF Aqueous Solution Under High Temperature and High Pressure", Journal of Crystal Growth, 79 (1986), pp. 970–973, and in Jia et al., "Hydrothermal Growth of KTP Crystals in the Medium Range of Temperature and Pressure", Journal of Crystal Growth, 99 (1990), pp. 900–904. Jia et al. disclose that by utilizing KF as a mineralizer relatively lower temperature and pressure can be employed for a hydrothermal KTP crystal growth process, and use of a pressure as low as 1000 $Kg/cm^2$ (i.e. 14223 psi) is exemplified. The use of pure KF mineralizer as described by Jia et al. provides a solubility of about 2% under the stated growth conditions, but like the process described in Laudise et al. supra, the higher solubility occurs near the phase stability boundary (with respect to temperature, pressure and mineralizer concentration), so the possibility of coprecipitation of an undesirable non-KTP phase exists.

A generally recognized family of KTP-type materials has the formula $MTiOXO_4$ where M is selected from the group consisting of $NH_4$, K, Rb, Tl, mixtures thereof and mixtures of Cs therewith, and X is selected from the group consisting of P, As and mixtures thereof. Hydrothermal processes for producing $KTiOPO_4$ are well studied. A problem associated with extending these studies to hydrothermal production of other crystals of the family involves the compositional variability of the mineralizers most suitable for growing each of the $MTiOXO_4$ family of materials. These variations make the development of new crystals, such as $KTiOAsO_4$, difficult and costly, since a new set of desirable growth parameters must be found for each of the isomorphs and their solid solutions.

SUMMARY OF THE INVENTION

This invention provides a method of increasing the rate of crystal growth in a hydrothermal process for growing a crystal at $MTiOXO_4$, wherein M is selected from the group consisting of $NH_4$, K, Rb, Tl, mixtures thereof, and mixtures of Cs therewith and X is selected from the group consisting of P and As and mixtures thereof. In general, the method is used with a hydrothermal process for growing said crystal in a growth region at elevated temperatures using a mineralizer comprising both $M^{+1}$ and $X^{+5}$, and comprises the step of employing a mineralizer further comprising $F^{-1}$ in an amount effective to increase the solubility of $MTiOXO_4$ in the mineralizer.

This invention further provides an aqueous mineralizer for the hydrothermal production of crystals of $MTiOXO_4$, consisting essentially of an aqueous composition (solution/mixture) of $F^{-1}$, $M^{+1}$ and $X^{+5}$ wherein $F^{-1}$ is present in an amount effective to increase the solubility of $MTiOXO_4$ in the mineralizer and to provide a $MTiOXO_4$ solubility of at least about 1% by weight at the operating temperature and pressure for the hydrothermal production. Optical quality crystals of at least 1 $mm^3$ can be grown using the mineralizer of this invention in times on the order of hours, rather than days and weeks.

It is an object of this invention to provide an improved mineralizer for use in hydrothermal processes to improve crystal growth rates for the $MTiOXO_4$ family of materials by increasing the solubility of $MTiOXO_4$ in the mineralizer.

It is a further object of this invention to provide mineralizer embodiments for the growth of MTiOAsO$_4$ materials at relatively low temperature and pressure.

DETAILED DESCRIPTION

Figure 1:
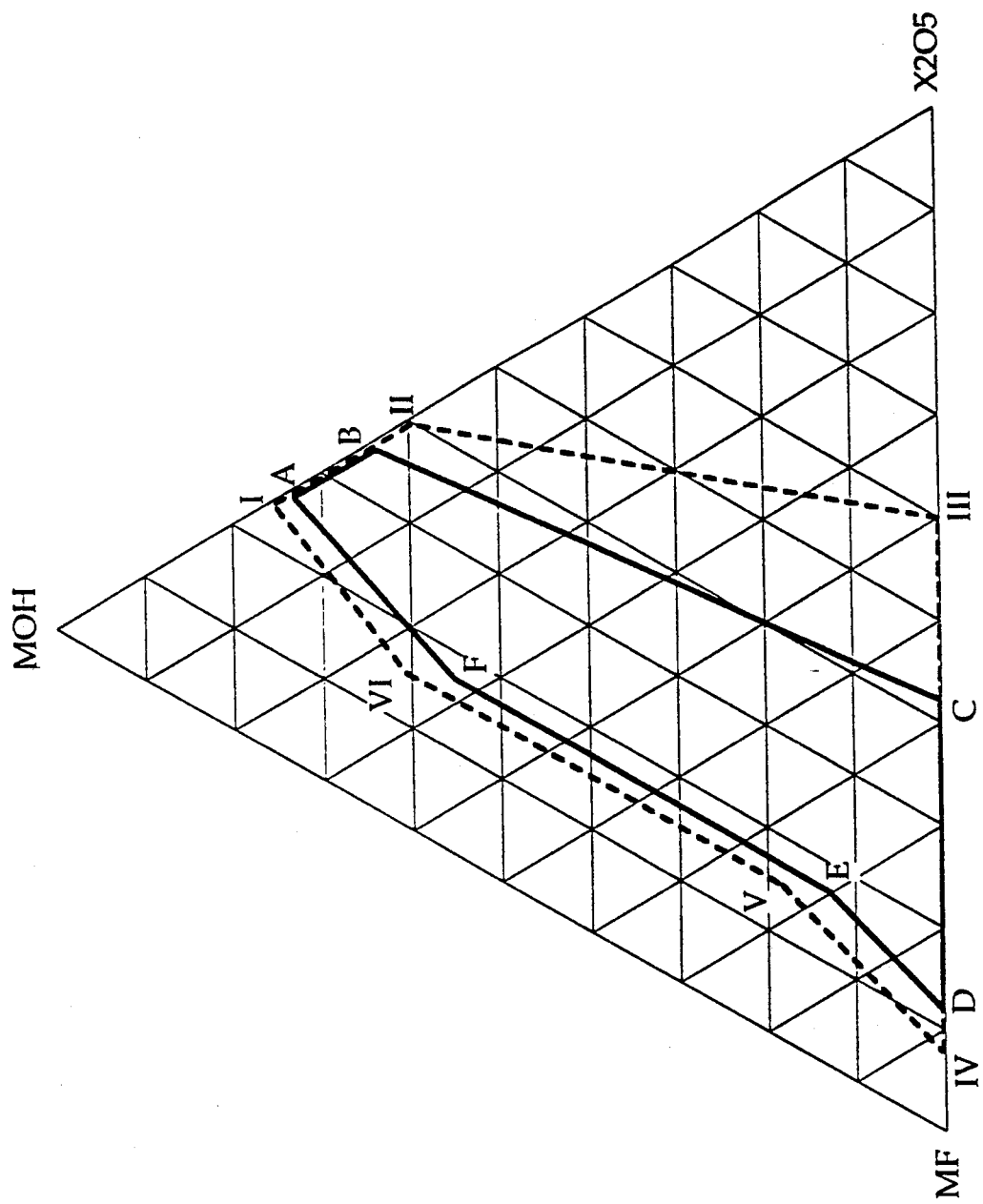
FIG. 1 is a ternary diagram which depicts the broad and preferred range of aqueous mineralizer composition for the production of MTiOXO$_4$ at a fluoride molality of from about 4 to 12, and from about 400° C. to 600° C. and from about 1000 to 2000 atmospheres pressure.

A hydrothermal process is provided in accordance with this invention which employs a concentrated aqueous mineralizer solutions comprising $F^{-1}$ in addition to $M^{+1}$ and $X^{+5}$ in a hydrothermal process to achieve relatively rapid, low pressure and/or low temperature growth of crystalline materials of the formula MTiOXO$_4$, wherein M is selected from the group consisting of NH$_4$, K, Rb, Tl, mixtures thereof and mixtures of Cs therewith (preferably K) and X is selected from the group consisting of P and As and mixtures thereof. An aqueous mineralizer solution is also provided in accordance with this invention which consists essentially an aqueous composition of $F^{-1}$, $M^{+1}$ and $X^{+5}$ (where M and X are defined above). The hydrothermal process for crystal growth at elevated temperature in a growth region, employs a growth medium comprising a mineralizer solution containing $F^{-1}$, $M^{+1}$ and $X^{+5}$, and employs either a growth region temperature from about 200° C. to about 800° C. or a pressure of less than 28,000 psi, or both, during crystallization. Typically, growth rates greater than 1 mm/side/week can be achieved at even the relatively lower temperatures studied in the art (i.e., 200° C. to 600° C.), and at operating pressures significantly lower than 8,000 psi, and preferably about 3,500 psi or less. For the best combination of effective crystal growth rate and economics of operation, the crystal growth pressure for the present invention is commonly in the range of from 2,000 to 14,000 psi. A typical temperature range is from about 250° C. to about 450° C.

The general procedure used for hydrothermal crystal growth is well known in the art and involves conducting the crystal growth at elevated temperature and pressure in a pressure vessel containing a means for nucleating crystal growth and a growth medium comprising a nutrient and an aqueous mineralizer solution. The preferred means for nucleating crystal growth are seed crystals which provide nucleation sites. In accordance with this invention seed crystals of MTiOXO$_4$, as defined above, can be utilized. Typical hydrothermal processes usually use a high pressure vessel or container in which single crystal seeds of the desired product are hung in a relatively supersaturated zone (i.e., a growth region) and a large quantity of polycrystalline nutrient of the same material is maintained in an unsaturated zone (i.e. a nutrient region), all together with an aqueous solution of mineralizer in which the nutrient is suitably soluble. The temperatures of the growth region and the nutrient region are selected in accordance with the slope of the solubility/temperature correlation for the specific mineralizer used. For solutions having a positive (normal) solubility/temperature correlation, the nutrient region is kept warmer than the growth region, while for solutions having a negative (retrograde) solubility/temperature correlation, the growth region is kept warmer than the nutrient region. Under steady-state growth conditions, the nutrient dissolves in the hotter (or cooler in the case of a retrograde correlation) nutrient zone, is transported to the cooler (or hotter in the case of a retrograde correlation) growth zone via natural convection caused by a density gradient or by forced convection (e.g., a rocker mechanism) and is deposited on the seed crystals. Large crystals are thereby produced.

The aqueous solution of mineralizer in combination with a nutrient consisting of a polycrystalline form of MTiOXO$_4$ or in combination with suitable precursors thereof makes up the growth medium. The amount of nutrient is not critical, provided enough is present to saturate the growth medium and provide sufficient material for the desired mass increase on the seed crystal(s). Nutrient surface area is typically 5 to 10 times the surface area of the seed crystal(s) so that the rate of nutrient dissolution does not undesirably limit crystal growth.

The mineralizer should contain both $M^{+1}$ and $X^{+5}$, as defined above and, in accordance with this invention must contain fluoride to achieve desirable growth rates. For example, materials such as described by Belt et al., "Nonlinear Optic Materials for Second Harmonic Generation (KTP)", Avionics Laboratory, Air Force Wright Aeronautical Laboratories, Air Force Systems Command, Wright-Patterson Air Force Base, Ohio (1984), formed from the combination of MH$_2$XO$_4$ and M$_2$HXO$_4$ are suitable for use along with MF. It is noted that the $F^{-1}$ provided for use in this invention need not be specifically added as the compound MF, but can be added using other fluoride sources which do not interfere with crystallization (e.g., a mixture of HF and MOH) which form MF in situ. The $X^{+5}$ is generally present in the mineral or combination as an oxide (e.g., $XO_4^{-3}$), and may be provided by adding compounds such as $X_2O_5$, and/or MH$_2$XO$_4$. In accordance with this invention it is preferred that the mole ratio of $M^{+1}$ to $X^{+5}$ in the mineralizer solution is from about 0.7:1 to about 2.5:1 to avoid formation of material other than the desired MTiOXO$_4$, such as anatase (TiO$_2$). If desired, an oxidizing agent, such as KNO$_3$ or H$_2$O$_2$, can be present in the growth medium in small concentrations to prevent reduction of Ti$^{+4}$ and to enhance crystal quality.

In accordance with the practice of this invention the concentration of $F^{-1}$ in the aqueous solution of mineralizer is preferably at least about 1 molal (as F), more preferably 2 molal or more, and is preferably 12 molal or less. The concentration of $M^{+1}$ in the aqueous solution of mineralizer is preferably at least 1 molal (as M), more preferably 2 molal or more, and is preferably 20 molal or less, more preferably 16 molal or less. A concentration of $M^{+1}$ from about 2 to 16 molal is considered particularly suitable for many applications. It is recognized that concentrations of $M^{+1}$ as high as 20 molal may not be achieved at room temperature, but can be achieved at the higher temperatures of operation. Consequently, solid material might be added with the aqueous solution of mineralizer, which would dissolve upon heating to provide an aqueous solution of mineralizer of the desired concentration. The concentration of $X^{+5}$ in the aqueous solution of mineralizer is preferably at least about 0.2 molal (as X), more preferably 1 molal or more, and is preferably 12 molal or less, more preferably 8 molal or less. The invention is considered particularly useful for growing crystals where X is As.

An aqueous mineralizer is provided in accordance with this invention for hydrothermal production of crystals of MTiOXO$_4$ which consists essentially of an aqueous composition containing $F^{-1}$, $M^{+1}$ and $X^{+5}$ wherein $F^-$ is present in an amount effective to increase the solubility of MTiOXO$_4$ in the mineralizer and to provide MTiOXO$_4$ solubility of at least about 1 percent by weight of the operating temperature and pressure of a hydrothermal crystal growth process.

While pH of the aqueous mineralizer of the present invention is not particularly critical to the crystal growth process per se, the pH can be important in the construction of pressure vessels for the process. For example, low pH (about 7 or less) and low operating temperature and pressure (e.g., 200° C. and 400 atmospheres) allows use of metal vessels with liners other than noble metals (e.g., Teflon ®).

Certain proportions of $M^{+1}$, $F^{-1}$ and $X^{+5}$ are considered particularly suitable for mineralizer compositions. Mineralizer systems of this invention may be represented on a ternary diagram, in terms of the relative mole percent of MF, MOH and $X_2O_5$. FIG. 1, for example represents a ternary diagram for mineralizer used for growing MTiOXO$_4$, wherein mole percentages in terms of MF, MOH and $X_2O_5$ are shown relative to each other (water of aqueous mineralizer is not included). The corners of the ternary diagram labeled MF, MOH and $X_2O_5$ thus represent 100 relative mole percent total of MF, MOH and $X_2O_5$ respectively; and each point within the diagram represents 100 mole percent total of MF, MOH and $X_2O_5$. Preferably for the growth of MTiOXO$_4$ at about 4 to 12 molal $F^{-1}$ and at about 400° to 600° C. and about 1000 to 2000 atmospheres pressure, the amounts of M, F and X are selected to provide a mineralizer compound falling within the polygon which is defined by I II III IV V VI I; and more preferably the amounts of M, F and X are selected to provide a mineralizer composition falling within the polygon which is defined by A B C D E F A. The diagram is especially useful for defining preferred ranges where M is K and X is P or As. Similar ranges apply to other MTiOXO$_4$ isomorphs. At lower temperatures (e.g., less than about 300° C.) and absolute fluoride concentrations below 4 molal, these zones expanded slightly to include the pure KF mineralizer as well.

While the practice of this invention is not bound by any theory or explanation, the role of fluoride ion in the aqueous mineralizer of this invention is believed to be related to the dissolution of MTiOXO$_4$. The dissolution can be written as follows:

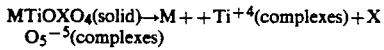

In a highly concentrated solution of $M^{+1}$ and/or $X^{+5}$, such as typically exists in MOH/$X_2O_5$-type aqueous mineralizer solutions equilibrium is shifted to the left in accordance with the law of mass action, favoring the precipitation of MTiOXO$_4$ and lowering its solubility. To obtain high solubility, one should therefore (1) find ions which readily form water-soluble complexes with titanium ($Ti^{+4}$); and (2) reduce the absolute concentration of $M^{+1}$ and/or $X^{+5}$. In accordance with this invention, fluoride ion complexes effectively with titanium and is believed to be primarily responsible for the high solubility of MTiOXO$_4$ in the mineralizers of the present invention. As is evident in FIG. 1, at high temperature (above about 400° C.) and high $F^{-1}$ concentrations (above about 4 molal), the amount of M and/or X cannot be reduced to zero because of the MTiOXO$_4$-phase stability requirements. Accordingly, the addition of M and X stabilizes the MTiOXO$_4$ phase field in the presence of fluoride.

A typical hydrothermal process using aqueous mineralizer of this invention comprises the steps of (b 1) providing in a vessel (a) means for nucleating growth of a crystal at MTiOXO$_4$ in a growth region, (b) a growth medium comprising nutrient for growing said crystal of MTiOXO$_4$ and an aqueous solution of mineralizer containing a mixture of F, M (i.e., NH$_4$, K, Rb, Tl, or partial Cs) and X (i.e., As or P) in a nutrient region, and (c) means for producing a temperature gradient between said growth region and said nutrient region; (2) employing in said nutrient region a nutrient temperature sufficient to effect solution of at least a portion of said nutrient; and (3) employing in said growth region an elevated growth temperature at which the MTiOXO$_4$ has a lower solubility than at said nutrient temperature and a pressure whereby growth of said crystal proceeds.

Under the mild conditions of temperature and pressure typically employed in the practice of this invention, the vessel chosen can be selected from a wide variety of types and sizes which can withstand these reaction temperatures and reaction pressures. Pressure vessel configurations typically utilize a noble metal container, or noble metal-clad container although other inert material such as Teflon ® can also be used for lining the container. Platinum, gold and Teflon ® are preferred liner materials for the crystal growth of potassium titanyl phosphate and potassium titanyl arsenate. A ladder-like rod configuration can be used to hang a number of seed crystals in the growth region portion of the lined vessel and a perforated baffle plate is used to separate the part of the container containing the growth region from the part containing a nutrient region. (The growth region can be located either above or below the nutrient region, depending upon the type of temperature/solubility correlation.) The baffle plate aids in maintaining the thermal gradient during growth. Nutrient is placed in the nutrient region, separated from the growth region by the baffle. An aqueous solution of mineralizer is loaded into the can along with the seed crystals. The can is sealed and typically placed in an autoclave with a sufficient amount of water to generate a pressure on the outer wall equal to the pressure generated inside the can at the predetermined maximum operating temperature. This "pressure balancing" approach prevents the can from collapsing and thus enables proper crystal growth. Typically, if a noble metal liner is used the need for the can is eliminated. Various conventional forced convection techniques such as mechanical rockers or stirrers can also be employed for the crystal growth process. Alternatively, a horizontal rather than vertical configuration can be utilized.

The percentage of fill is defined as the room temperature atmospheric pressure volume of the solution divided by the free volume of the container, i.e., the container volume less the volume of nutrient, seed crystals, frame or ladder, and baffle. In the case of a lined vessel, the container's volume is the volume of the vessel. Common practice in the art has generally been to limit the percentage of fill so that excessive pressure is not encountered at the growth temperature, and a preferred fill range from 70 to 85% has typically been used depending on mineralizer concentration. Percentages of fill above about 85% have generally been avoided because the resulting pressure is generally considered excessive for assuring vessel integrity. In accordance with this invention percentages of fill of from about 60% to 95% are preferably used, with fill percentages of from about 70% to 85% being most generally preferred.

The following non-limiting examples further illustrate practice of the invention.

EXAMPLES

Hydrothermal solubilities of $MTiOXO_4$ may be studied using the following standard solution-quenching method. A mineralizer mixture consisting of typically 2 to 4 ml of $H_2O$ and varying amounts of MF, $X_2O_5$ and/or $MH_2XO_4$, is placed in a 0.375 inch gold or platinum tube along with a pre-weighed amount of excess $MTiOXO_4$ powder. The two ends of the tube are then welded shut, and the tube is placed in an internally heated pressure vessel and brought to a specified temperature and pressure. The solution is held at this temperature and pressure until equilibrium solubility is established (typically from 1 to 3 days). The pressure vessel is then quenched quickly (about 600° C./min.) to room temperature. Rapid cooling is used to keep all dissolved $MTiOXO_4$ in solution. Upon cutting-open the tube, the pH of the solution is measured and the undissolved $MTiOXO_4$ powder and crystals are recovered and weighed. The $MTiOXO_4$ weight loss is taken as the hydrothermal solubility at the temperature and pressure condition used.

Example 1

The standard solution-quenching method outlined above was used to determine the relationship of solubility to pH at from 400° C. to 600° C. and from 1000 atmospheres to 2000 atmospheres. Results for a variety of aqueous mineralizer compositions in accordance with this invention for the production of $KTiOAsO_4$ are shown in Table 1.

TABLE 1 pH's of Quenched Mineralizer Solutions and its Associated Solubilities for KTA[1]

| Mineralizer Solutions | % Solubility | pH |
|---|---|---|
| 12M $KH_2AsO_4$/2.4M KOH (Control) | 0.24 | 9 |
| 8M KF/6.9M $KH_2AsO_4$ | 7.97 | 7 |
| 8M KF/4M $KH_2AsO_4$/2M $As_2O_5$ | 9.59 | 5 |
| 4M KF/1.7M $KF_2AsO_4$/0.9M $As_2O_5$ | 5.07 | 4 |
| 4M KF/1.3M $As_2O_5$ | 5.93 | 3 |
| 4M KF/1.7M $As_2O_5$ | 5.66 | 2 |
| 4M KF/2.5M $As_2O_5$ | 4.50 | 1 |

[1] $KTiOAsO_4$

The Control mineralizer known in the art (i.e., mineralizer containing no KF) has a very low solubility.

Example 2

The standard solution-quenching method outlined above was used to determine the solubility of $MTiOXO_4$ for a variety of isomorphs of $MTiOXO_4$ in the aqueous mineralizer of the present invention. Results are shown in Table 2.

TABLE 2

Hydrothermal Solubility of Various KTP Isomorphs in KF Containing Mineralizer Solutions

|  | Mineralizers | Temp./Press. | % Solubility | Ti[9] |
|---|---|---|---|---|
| KTP[1] | 4M KF/2M $P_2O_5$ | 400° C./1000 atm | 3.96 | 0.30 |
| RTP[2] | 4M RbF/2M $P_2O_5$ | 400° C./1000 atm | 5.72 | 0.40 |
| TTP[3] | 4M TlF/2M $P_2O_5$ | 400° C./1000 atm | 6.94 | 0.66 |
| KTA[4] | 4M KF/2M $As_2O_5$ | 400° C./1000 atm | 4.72 | 0.33 |
| RTA[5] | 4M RbF/2M $As_2O_5$ | 400° C./1000 atm | 5.20 | 0.34 |
| TTA[6]T | 4M TlF/2M $As_2O_5$ | 400° C./1000 atm | 7.40 | 0.66 |
| KTP | 4M KF/8M $KH_2PO_4$ | 600° C./2000 atm | 2.38 | 0.28 |
| RTP | 4M RbF/8M $RbH_2PO_4$ | 600° C./2000 atm | 2.43 | 0.28 |
| NTP[7] | 4M $NH_4F$/4M $NH_4H_2PO_4$ | 200° C./1000 atm | 4.48 | 0.28 |
| KTA | 4M KF/8M $KH_2AsO_4$ | 600° C./2000 atm | 2.69 | 0.30 |
| RTA | 4M RbF/8M $RbH_2AsO_4$ | 600° C./2000 atm | 2.68 | 0.30 |
| NTA[8] | 4M $NH_4F$/4M $NH_4H_2AsO_4$ | 200° C./1000 atm | 5.92 | 0.30 |
| $R_{0.5}K_{0.5}Ta$ | 4M (K + Rb)F/8M $KH_2AsO_4$ | 600° C./2000 atm | 4.42 | 0.49 |
| $KTP_{0.5}A_{0.5}$ | 4M KF/8M $KH_2$(P + As)$O_4$ | 600° C./2000 atm | 4.34 | 0.49 |
| $Cs_{0.67}K_{0.33}TP$ | 4M CsF/8M $KH_2PO_4$ | 600° C./2000 atm | 6.84 | 0.65 |

[1] $KTiOPO_4$
[2] $RbTiOPO_4$
[3] $TlTiOPO_4$
[4] $KTiOAsO_4$
[5] $RbTiOAsO_4$
[6] $TlTiOAsO_4$
[7] $NH_4TiOPO_4$
[8] $NH_4TiOAsO_4$
[9] molal Ti concentration in the mineralizer Table 2 shows that low temperature (200° C.) can be used with $MF/P_2O_5$ or $MF/As_2O_5$ mineralizer, while providing more than adequate solubility of $MTiOPO_4$ or $MTiOAsO_4$.

Example 3

The standard solution-quenching method outlined above was used to determine the solubility of $KTiOPO_4$ and $KTiOAsO_4$ at various operating temperatures and pressures. Results are shown in Table 3.

TABLE 3

Temperature and Pressure Dependence of Hydrothermal Solubility in KF Containing Mineralizer Solutions

|  | Mineralizers | Temp./Press. | % Solubility | % Difference[3] |
|---|---|---|---|---|
| KTP[1] | 4M KF/8M $KH_2PO_4$ | 400° C./1000 atm | 1.34 | |
|  | 4M KF/8M $KH_2PO_4$ | 600° C./2000 atm | 2.38 | 1.04 |

TABLE 3-continued

Temperature and Pressure Dependence of Hydrothermal Solubility in KF Containing Mineralizer Solutions

| | Mineralizers | Temp./Press. | % Solubility | % Difference[3] |
|---|---|---|---|---|
| | 4M KF/2M $P_2O_5$ | 400° C./1000 atm | 3.96 | |
| | 4M KF/2M $P_2O_5$ | 600° C./2000 atm | 3.20 | −0.76 |
| | 8M KF/2.4M $P_2O_5$ | 400° C./1000 atm | 10.53 | |
| | 8M KF/2.4M $P_2O_5$ | 600° C./2000 atm | 10.16 | −.37 |
| $KTA^{(2)}$ | 4.8M KOH/12M $KH_2AsO_4$ | 400° C./1000 atm | 0.00 | |
| Control | 4.8M KOH/12M $KH_2AsO_4$ | 600° C./2000 atm | 0.34 | 0.34 |
| | 4M KF/8M $KH_2AsO_4$ | 400° C./1000 atm | 1.50 | |
| | 4M KF/8M $KH_2AsO_4$ | 600° C./2000 atm | 2.69 | 1.19 |
| | 4M KF/2M $As_2O_5$ | 400° C./1000 atm | 5.72 | |
| | 4M KF/2M $As_2O_5$ | 600° C./2000 atm | 4.81 | −0.91 |
| | 8M KF/2.4M $As_2O_5$ | 400° C./1000 atm | 12.39 | |
| | 8M KF/2.4M $As_2O_5$ | 600° C./2000 atm | 12.07 | −0.37 |
| | 12M KF/3.6M $As_2O_5$ | 400° C./1000 atm | 14.37 | |
| | 12M KF/3.6M $As_2O_5$ | 600° C./2000 atm | 18.10 | 3.73 |

[1]$KTiOPO_4$
[2]$KTiOAsO_4$
[3]This represents the difference in solubility between runs of a particular mineralizer at the two temperature and pressure conditions illustrated.

It can be seen from Table 3 that the aqueous mineralizers known in the art (Controls containing no KF), provide very low solubility of $KTiOAsO_4$.

Example 4

Growth of $KTiOPO_4$

A mixture consisting of 3.5 ml of $H_2O$, 1.63 g of KF, 1.29 g of $P_2O_5$ and about 1.8 g of fine (<0.5 mm$^3$) $KTiOPO_4$ crystals was placed in a gold tube (0.375 inches in diameter and about 6 inches long) and both ends were hermetically sealed shut. The tube was placed in an internally heated pressure vessel which was brought to a temperature of 600° C. and 2000 atm. pressure. Argon was used to pressurize the vessel. A temperature difference of about 25° C. was established between the center of the gold tube and its two ends by cooling the two ends of the pressure vessel. The temperature and pressure were maintained for 16 hours during which time crystallization of $KTiOPO_4$ took place via temperature gradient transport. The vessel was then quenched to room temperature and optical quality crystals of up to about 1.5×1×1 mm$^3$ were recovered from the gold tubes.

Example 5

Growth of $KTiOAsO_4$

A mixture consisting of 3.5 ml of $H_2O$, 1.63 g of KF, 2.09 g of $As_2O_5$ and about 1.8 g of fine (<0.5 mm$^3$) $KTiOAsO_4$ crystals was placed in a gold tube (0.375 inches in diameter and about 6 inches long) and both ends were hermetically sealed shut. The tube was placed in an internally heated pressure vessel which was brought to a temperature of 600° C. and 2000 atm. pressure. Argon was used to pressurize the vessel. A temperature difference of about 25° C. was established between the center of the gold tube and its two ends by cooling the two ends of the pressure vessel. The temperature and pressure were maintained for 16 hours during which time crystallization of $KTiOAsO_4$ took place via temperature gradient transport. The vessel was then quenched to room temperature and optical quality crystals of up to about 1.5×1×1 mm$^3$ were recovered from the gold tubes.

Example 6

Growth of $KTiOAsO_4$

A mixture consisting of 3.5 ml of $H_2O$, 0.81 g of KF, 1.38 g of $As_2O_5$ and about 0.46 g of fine (<0.5 mm$^3$) $KTiOAsO_4$ crystals was placed in a gold tube (0.375 inches in diameter and about 6 inches long) and both ends were hermetically welded shut. The tube was placed in an internally heated pressure vessel which was brought to a temperature of 800° C. and 2000 atm. pressure. Argon was used to pressurize the vessel. The temperature was held constant at 800° C. for 1 hour, and then cooled at a rate of 5° C. per hour to a temperature of 600° C. After holding the temperature at 600° C. for two more hours, the vessel was quenched to room temperature and the gold tube was cut open to remove the grown crystals. Optical quality $KTiOAsO_4$ crystals of up to about 2.0×1.5×1.5 mm$^3$ were recovered from the gold tubes.

Example 7

Growth of $KTiOAsO_4$

A mixture of 3.5 ml $H_2O$, 1.63 g KF, 0.99 g $As_2O_5$, 1.91 g $KH_2AsO_4$ and about 1.33 g of fine (<0.5 mm$^3$) $KTiOAsO_4$ crystals was placed in a gold tube (0.375 inches in diameter and about 6 inches long) and both ends were hermetically welded shut. The tube was placed in an internally heated pressure vessel and brought to 400° C. and 500 atmospheres pressure. Argon was used to pressurize the vessel. The temperature was held constant at 400° C. for 5 hours, and then cooled at a rate of 5° C./hr. to 300° C. After holding at 300° C. for 8 more hours, the vessel was quenched to room temperature and the gold tube was cut open to remove the grown crystals. Optical quality $KTiOAsO_4$ crystals of up to about 1×1×1 mm$^3$ were obtained.

The examples serve to illustrate particular embodiments of the invention. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. In a hydrothermal process for growing a crystal of $MTiOXO_4$ wherein M is selected from the group consisting of $NH_4$, K, Rb, Tl, mixtures thereof, and mixtures thereof with Cs, and X is selected from the group consisting of P, As and mixtures thereof, in a growth region at elevated temperature using an aqueous mineralizer comprising both $M^{+1}$ and $X^{+5}$, a method of increasing the rate of crystal growth in said hydrothermal process comprising the step of employing a mineralizer further comprising $F^{-1}$ in an amount effective to increase the solubility of $MTiOXO_4$ in the mineralizer.

2. The hydrothermal process of claim 1 wherein X is P.

3. The hydrothermal process of claim 1 wherein X is As.

4. The hydrothermal process of claim 1, 2 or 3 wherein M is K.

5. The hydrothermal process of claim 1 comprising the steps of providing in a vessel (a) means for nucleating growth of a crystal in a growth region, (b) a growth medium comprising nutrient for growing said crystal of $MTiOXO_4$ and an aqueous mineralizer containing a mixture of F, M and X in a nutrient region, and (c) means for producing a temperature gradient between said growth region and said nutrient region; (2) employing in said nutrient region an elevated temperature sufficient to effect solution of at least a portion of said nutrient; and (3) employing in said growth region an elevated growth temperature at which the $MTiOXO_4$ has a lower solubility than at said nutrient temperature and a pressure whereby growth of said crystal proceeds.

6. The hydrothermal process of claim 5 wherein the concentration of $F^{-1}$ in the mineralizer solution is at least 1 molal, the concentration of $M^{+1}$ is from 1 to 20 molal and the concentration of $X^{+5}$ is from 0.2 to 12 molal.

7. The hydrothermal process of claim 5 wherein the concentration of $F^-$ in the mineralizer solution is from 2 to 8 molal, the concentration of $M^{+1}$ is from 2 to 16 molal, and the concentration of $X^{+5}$ is from 1 to 8 molal.

8. The hydrothermal process of claim 1 or claim 5 wherein the growth region temperature is from about 200° C. to about 800° C.

9. The hydrothermal process of claim 8 wherein the growth region temperature is 250° C. to 600° C.

10. The hydrothermal process of claim 1 or claim 5 wherein the pressure is less than 28,000 psi.

11. The hydrothermal process of claim 10 wherein the pressure is from 2,000 psi to 14,000 psi.

* * * * *